United States Patent
König et al.

(10) Patent No.: US 11,942,763 B2
(45) Date of Patent: Mar. 26, 2024

(54) SEMICONDUCTOR LASER, OPERATING METHOD FOR A SEMICONDUCTOR LASER, AND METHOD FOR DETERMINING THE OPTIMUM FILL FACTOR OF A SEMICONDUCTOR LASER

(71) Applicant: OSRAM OLED GmbH, Regensburg (DE)

(72) Inventors: Harald König, Bernhardswald (DE); Bernhard Stojetz, Wiesent (DE); Alfred Lell, Maxhütte—Haidhof (DE); Muhammad Ali, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 273 days.

(21) Appl. No.: 16/954,961

(22) PCT Filed: Dec. 14, 2018

(86) PCT No.: PCT/EP2018/085005
§ 371 (c)(1),
(2) Date: Jun. 17, 2020

(87) PCT Pub. No.: WO2019/121407
PCT Pub. Date: Jun. 27, 2019

(65) Prior Publication Data
US 2021/0367406 A1    Nov. 25, 2021

(30) Foreign Application Priority Data
Dec. 19, 2017   (DE) .......................... 102017130594.7

(51) Int. Cl.
*H01S 5/40*   (2006.01)
*B23K 26/122*   (2014.01)
(Continued)

(52) U.S. Cl.
CPC .......... *H01S 5/4031* (2013.01); *B23K 26/122* (2013.01); *H01S 5/0237* (2021.01);
(Continued)

(58) Field of Classification Search
None
See application file for complete search history.

(56) References Cited

U.S. PATENT DOCUMENTS

| | | | | |
|---|---|---|---|---|
| 8,031,751 B2* | 10/2011 | Yamasaki | ............... | H01S 5/024 372/50.12 |
| 8,565,276 B2* | 10/2013 | Krejci | ................... | H01S 5/0237 372/66 |

(Continued)

FOREIGN PATENT DOCUMENTS

| | | |
|---|---|---|
| CN | 101662124 A | 3/2010 |
| DE | 102005019560 A1 | 1/2006 |

(Continued)

OTHER PUBLICATIONS

Hu et al. ("Thermal analysis of gan-based laser diode mini-array"; Chinese Phys. B 27 094208, 2018). (Year: 2018).*

(Continued)

*Primary Examiner* — Tod T Van Roy
(74) *Attorney, Agent, or Firm* — MH2 TECHNOLOGY LAW GROUP LLP

(57) ABSTRACT

In one embodiment, the semiconductor laser (1) comprises a semiconductor layer sequence (2) based on the material system AlInGaN with at least one active zone (22) for generating laser radiation. A heat sink (3) is thermally connected to the semiconductor layer sequence (2) and has a thermal resistance towards the semiconductor layer sequence (2). The semiconductor layer sequence (2) is divided into a plurality of emitter strips (4) and each emitter strip (4) has a width (b) of at most 0.3 mm in the direction (Continued)

perpendicular to a beam direction (R). The emitter strips (4) are arranged with a filling factor (FF) of less than or equal to 0.4. The filling factor (FF) is set such that laser radiation having a maximum optical output power (P) can be generated during operation.

12 Claims, 6 Drawing Sheets

(51) Int. Cl.
    *H01S 5/0237* (2021.01)
    *H01S 5/024* (2006.01)
    *H01S 5/042* (2006.01)
    *H01S 5/22* (2006.01)
    *H01S 5/323* (2006.01)
    *H01S 5/02345* (2021.01)

(52) U.S. Cl.
    CPC ...... *H01S 5/02469* (2013.01); *H01S 5/02492* (2013.01); *H01S 5/04254* (2019.08); *H01S 5/22* (2013.01); *H01S 5/32341* (2013.01); *H01S 5/02345* (2021.01); *H01S 5/04256* (2019.08)

(56) References Cited

U.S. PATENT DOCUMENTS

| | | | |
|---|---|---|---|
| 10,770,861 B1* | 9/2020 | Osinski | H01S 5/041 |
| 10,923,878 B1* | 2/2021 | Raring | H01S 5/0651 |
| 2005/0254539 A1 | 11/2005 | Klimek | |
| 2009/0080485 A1* | 3/2009 | Yamasaki | B82Y 20/00 |
| | | | 372/50.1 |
| 2009/0104727 A1 | 4/2009 | Krejci et al. | |
| 2010/0040098 A1 | 2/2010 | Parent et al. | |
| 2011/0200064 A1* | 8/2011 | Banno | H01S 5/0237 |
| | | | 372/44.01 |
| 2012/0287958 A1* | 11/2012 | Lell | H01S 5/4043 |
| | | | 372/45.01 |
| 2012/0314398 A1* | 12/2012 | Raring | H01S 5/34333 |
| | | | 362/230 |
| 2017/0070031 A1* | 3/2017 | Takigawa | H01S 5/06216 |
| 2017/0331257 A1* | 11/2017 | Eichler | H01L 21/0254 |
| 2020/0412102 A1* | 12/2020 | Nozaki | H01S 5/0207 |
| 2021/0296851 A1* | 9/2021 | Hagino | H01S 5/02476 |
| 2021/0367406 A1* | 11/2021 | König | H01S 5/02469 |

FOREIGN PATENT DOCUMENTS

| | | | | |
|---|---|---|---|---|
| EP | 1143583 A2 | * | 10/2001 | ........... H01S 5/0226 |
| JP | 2004106048 | * | 4/2004 | |
| JP | 200410606048 A | | 4/2004 | |
| JP | 2009076730 A | | 4/2009 | |
| JP | 2010034267 A | | 2/2010 | |
| JP | 2011166068 A | | 8/2011 | |
| JP | 2012164981 A | | 8/2012 | |
| JP | 2013179210 A | * | 9/2013 | |
| KR | 20100106927 A | * | 10/2010 | |
| WO | 2012101686 A1 | | 8/2012 | |

OTHER PUBLICATIONS

Najda et al., "AlGaInN laser diode technology for de-fence, security & sensing applications", Proc. of SPIE, vol. 9254, 2014, 8 pages.

Spiewak et al., "Impact of thermal crosstalk between emitters on power roll-over in nitridebased blue-violet laser bars", Semiconductor Science and Technology, vol. 32, 2017, 8 pages.

Kuc et al., "Thermal crosstalk in arrays of III-N-based Lasers", Materials Science and Engineering B, vol. 78, 2013, 8 pages.

"Notice of Reasons for Rejection," issued in corresponding Japanese Patent Application No. 2020-529697 includes English translation, 12 pages.

\* cited by examiner

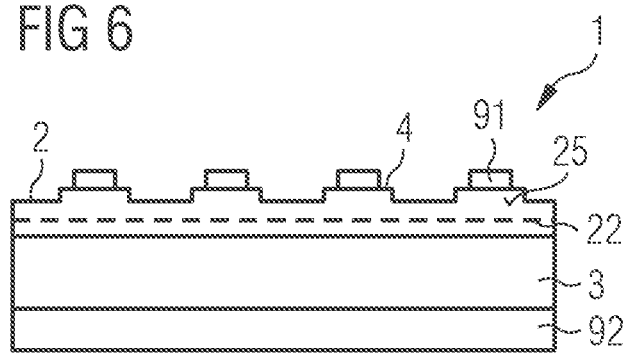
FIG 6
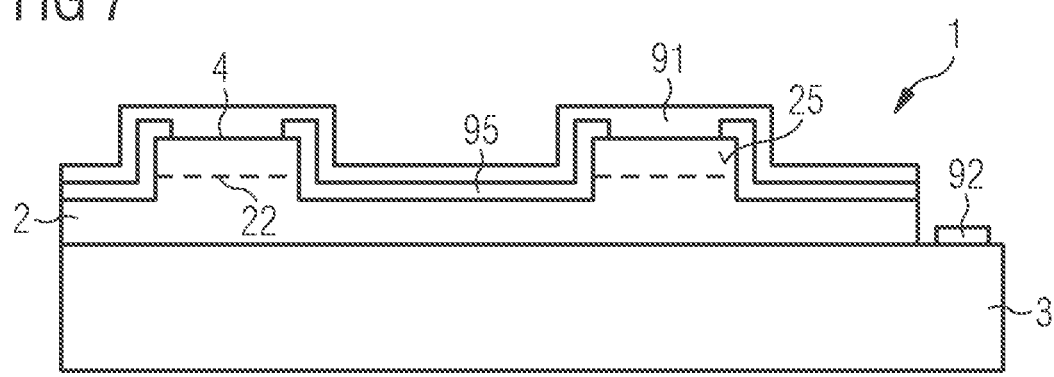
FIG 7
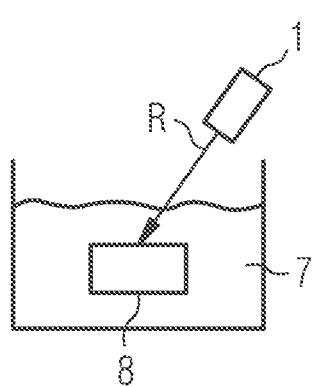
FIG 8
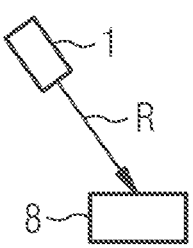
FIG 9
A)
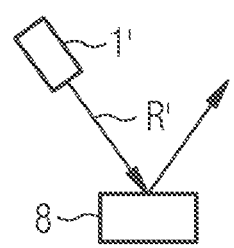
B)

FIG 14

Figure 10:
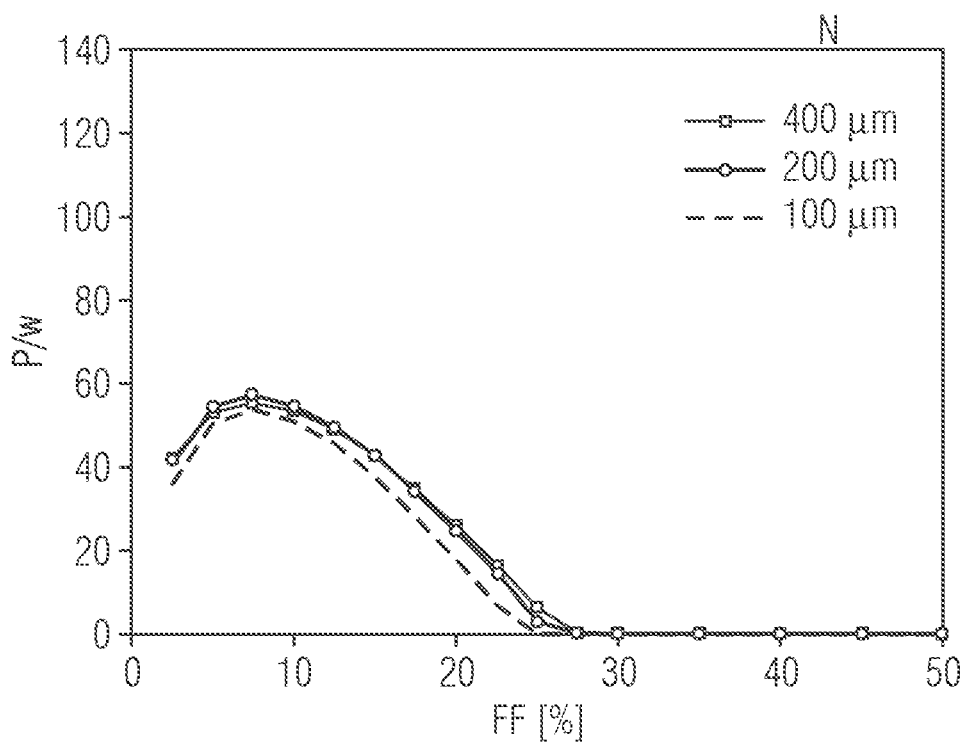
Figure 11:
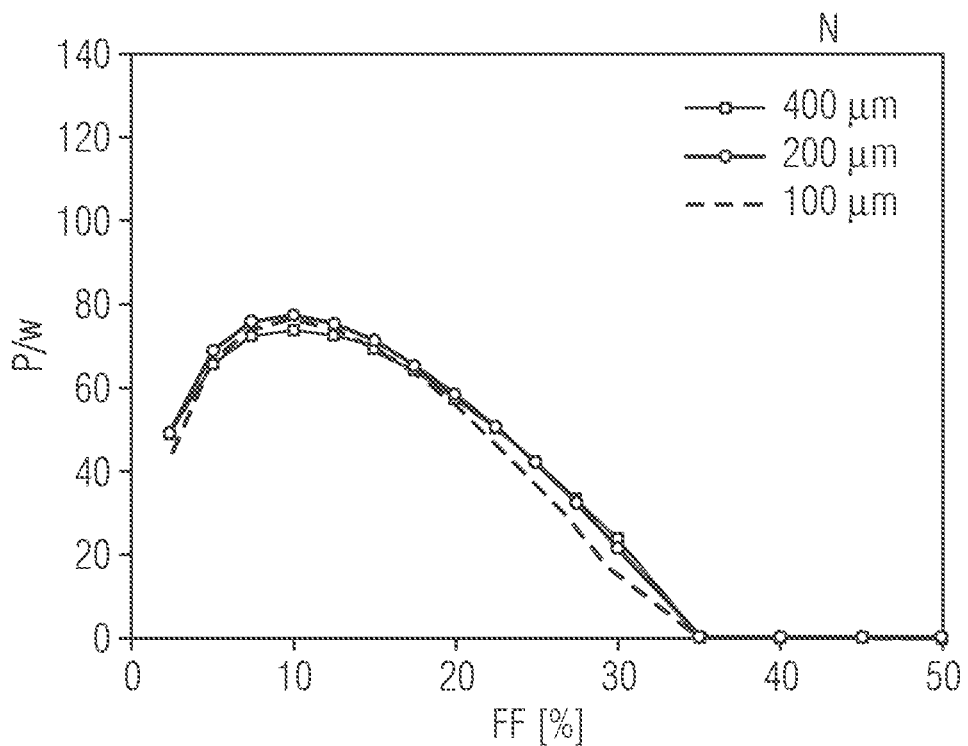
Figure 12:
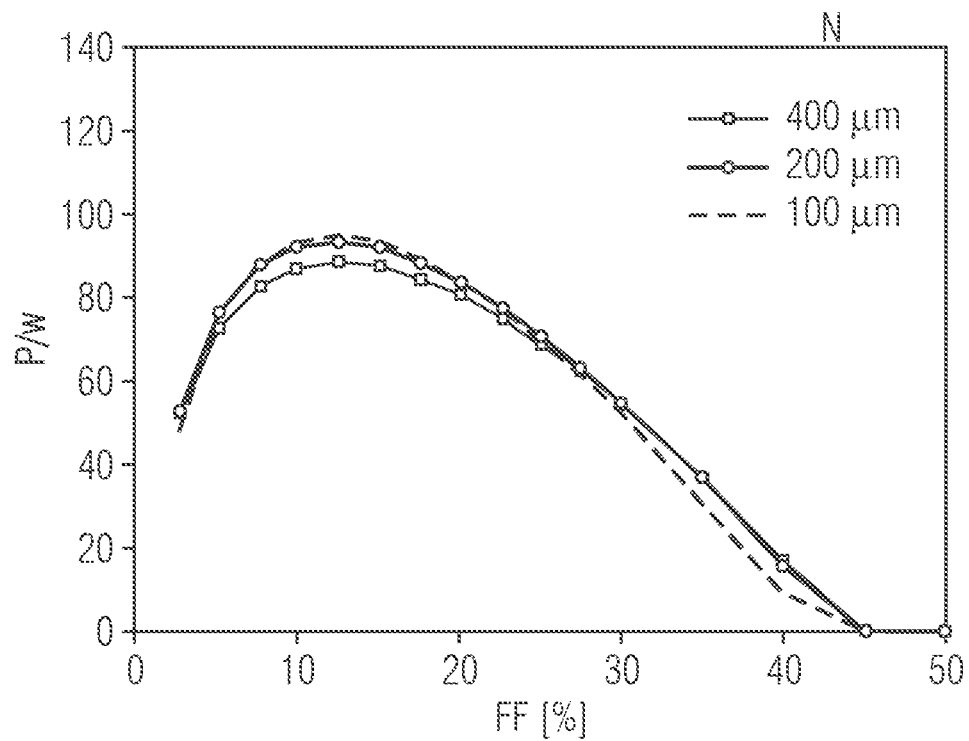
Figure 13:
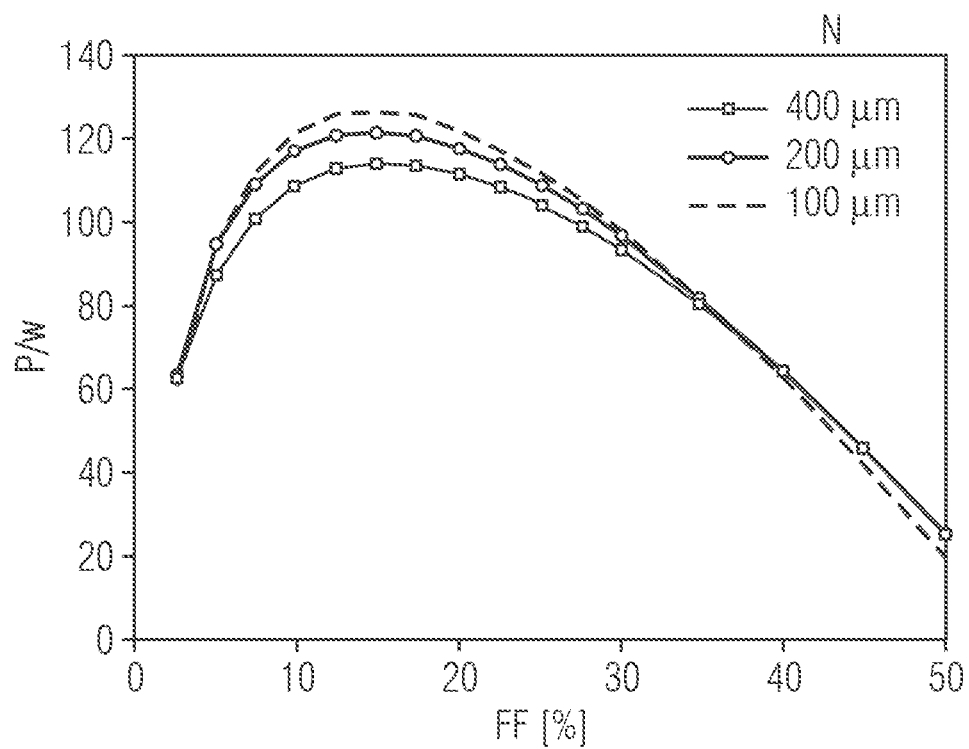

|       | L [µm] | w [µm] | f [%] | c1    | c2     | FF [%] | Rth [K/W] |
|-------|--------|--------|-------|-------|--------|--------|-----------|
| FIG 10 | 1200   | 9200   | 100   | 0,714 | 0,0154 | 8      | 0,99      |
| FIG 11 | 1200   | 9200   | 100   | 0,534 | 0,0154 | 10     | 0,75      |
| FIG 12 | 1200   | 9200   | 100   | 0,430 | 0,0154 | 12     | 0,61      |
| FIG 13 | 1200   | 9200   | 80    | 0,430 | 0,0154 | 15     | 0,46      |

FIG 15

(I) $\quad P = Sh(I_{op} - I_s)$ (II) $\quad P = U \cdot I_{op} - P_{loss}$
$\quad\quad = R_s I_{op}^2 + U_{op} I_{op} - P_{loss}$ (III) $\quad T_j = T_{hs} + R_{th} P_{loss}$ (IV) $\quad P = R_s I_{op}^2 + U_{op} I_{op} \dfrac{T_j - T_{hs}}{R_{th}}$ (I = IV) $\quad Sh(I_{op} - I_s) = (IV)$
$\quad\quad => 0 = R_s I_{op}^2 + (U_{op} Sh) I_{op} + Sh\, I_s - \dfrac{T_j - T_{hs}}{R_{th}}$ (V) $\quad I_{op} = \dfrac{-(U_{op} - Sh) \pm \sqrt{(U_{op} - Sh)^2 - 4R_s\left(I_s Sh - \dfrac{T_j - T_{hs}}{R_{th}}\right)}}{2R_s}$ $$I_S = J_S * L * w * FF$$
$$R_S = \rho / (L * w * FF)$$
$$R_{th} = l * 10000 / w * (c_1(L) + c_2 / FF)$$

$$A = L * w * FF$$

SEMICONDUCTOR LASER, OPERATING METHOD FOR A SEMICONDUCTOR LASER, AND METHOD FOR DETERMINING THE OPTIMUM FILL FACTOR OF A SEMICONDUCTOR LASER

CROSS-REFERENCE TO RELATED APPLICATIONS

This patent application is a national stage entry from International Application No. PCT/EP2018/085005, filed on Dec. 14, 2018, published as International Publication No. WO 2019/121407 A1 on Jun. 27, 2019, and claims priority under 35 U.S.C. § 119 from German patent application 10 2017 130 594.7, filed Dec. 19, 2017, the entire contents of all of which are incorporated herein by reference.

A semiconductor laser is provided. Further, an operating method for such a semiconductor laser is provided. Moreover, a method for determining an optimal filling factor of such a semiconductor laser is provided.

An object to be achieved is to provide a semiconductor laser which is based on the material system AlInGaN and which can be operated with high optical output powers.

This object is achieved, inter alia, by a semiconductor laser having the features of claim 1. Preferred developments are the subject-matter of the remaining claims.

According to at least one embodiment, the semiconductor laser comprises a semiconductor layer sequence. The semiconductor layer sequence comprises one or more active zones. The at least one active zone is configured to generate laser radiation. The laser radiation produced is in particular near ultraviolet radiation and/or blue light and/or green light. For example, a wavelength of maximum intensity of the laser radiation generated during operation is at least 360 nm or 395 nm and/or at most 560 nm or 445 nm.

According to at least one embodiment, the semiconductor layer sequence is based on the material system AlInGaN. That is, essential components of a crystal lattice of the semiconductor layer sequence are Al, In, Ga and N. A total formula of the semiconductor material of the semiconductor layer sequence is thus $Al_nIn_{1-n-m}Ga_mN$, where $0 \leq n \leq 1$, $0 \leq m \leq 1$ and $n+m \leq 1$ applies. Preferably, for at least one layer or for all layers of the semiconductor layer sequence $0 < n \leq 0.8$, $0.4 \leq m < 1$ and $n+m \leq 0.95$ applies. In particular, $n=0$ applies. The semiconductor layer sequence can have dopants and additional components. For the sake of simplicity, however, only the essential components of the crystal lattice of the semiconductor layer sequence are given, that is, Al, Ga, In or N, even if these can be partially replaced and/or supplemented by small amounts of further substances.

According to at least one embodiment, the semiconductor laser comprises one or more heat sinks, also referred to as a heat spreader. The at least one heat sink is thermally connected to the semiconductor layer sequence. In other words, the heat sink is configured to cool and heat the semiconductor layer sequence. The semiconductor layer sequence has a thermal resistance towards the heat sink. In particular, the thermal resistance is present between the semiconductor layer sequence and the heat sink or also between the active zone and the heat sink. The thermal resistance can be determined in particular experimentally, in the case of a given heat sink, a given semiconductor layer sequence and a given connection between the heat sink and the semiconductor layer sequence.

According to at least one embodiment, the semiconductor layer sequence is divided into a plurality of emitter strips. Furthermore, each of the emitter strips is preferably designed to generate the laser radiation. In the direction perpendicular to a beam direction, a width of the emitter strips is at most 0.3 mm or 0.2 mm. A resonator or a plurality of resonators of the semiconductor layer sequence are defined by the emitter strips. The beam direction preferably runs parallel to a resonator longitudinal direction and thus parallel to a longitudinal direction of the emitter strips.

According to at least one embodiment, the emitter strips have a filling factor of less than or equal to 0.5 or less than or equal to 0.4 or less than or equal to 0.3 in relation to the semiconductor layer sequence before the subdivision or structuring or in relation to an envelope around all emitter strips. In other words, the filling factor is comparatively low. Preferably, only those structures of the semiconductor layer sequence which intentionally contribute to the generation of the laser radiation are referred to as emitter strips. This means that possibly defective emitter strips, which are originally provided for generating the laser radiation, can count as emitter strips in the determination of the filling factor.

According to at least one embodiment, the filling factor is set such that, during operation, the laser radiation can be generated with a maximum optical output power. In other words, the filling factor is optimized towards the optical output power.

According to at least one embodiment, the filling factor is defined as a quotient of an average width of the emitter strips and an average grid dimension. If the semiconductor layer sequence and/or the heat sink comprises/comprise wide edges that are free of emitter strips, then the envelope around the emitter strips can be defined as a base surface.

The filling factor is then obtained as a quotient of the surfaces of the emitter strips all together with the surface within the envelope; the envelope being a shortest closed line which includes the emitter strips.

In at least one embodiment, the semiconductor laser comprises a semiconductor layer sequence based on the material system AlInGaN with at least one active zone for generating laser radiation. At least one heat sink is thermally connected to the semiconductor layer sequence and has a thermal resistance towards the semiconductor layer sequence. The semiconductor layer sequence is divided into a plurality of emitter strips and each emitter strip has a width of at most 0.3 mm in the direction perpendicular to a beam direction. The emitter strips are arranged with a filling factor of less than or equal to 0.4. The filling factor is set such that laser radiation having a maximum optical output power can be generated during operation.

Up to now, for the green, the blue or the near-ultraviolet spectral range, no laser bars are commercially available as light source, but only individual emitter components. In order to achieve optical powers in the range above approximately 5 W, it is necessary in the case of individual emitter components to combine the radiation from a plurality of individual emitters with complex and expensive optics. This is possible with justifiable expenditure only up to an optical power of approximately 100 W, since otherwise the number of optics to be adjusted individually becomes too large. In contrast, a single laser bar is in principle capable of producing optical powers in the range of 100 W.

One reason why commercially no laser bars based on the InGaN material system are available in the blue, green, or UV spectral range is essentially that such bars have a comparatively high probability of individual emitter defects and thus contain comparatively many non-functioning emitters. Furthermore, an efficiency of an electro-optical conversion is clearly below the typical values of infrared lasers which can achieve an electro-optical efficiency of about 65%.

With progressing technology, for example, in the epitaxy of AlInGaN components, electro-optical efficiencies around 40% can now also be achieved with this material system. In addition, a significantly reduced number of defective emitters can be expected due to continuous advances in epitaxy and in chip processes. Therefore, the concept of laser bars, as established for high performance infrared lasers, can be transferred to the visible spectral range.

An important aspect in high-power lasers is cost efficiency, that is, the cost per watt of optical output power. Lasers having optical output powers in the range of 200 W to 300 W are commercially available for the infrared spectral range. The required epitaxial surface is decisive for the costs of the lasers. In the case of infrared high-power lasers having the highest output powers, therefore, a filling factor, that is, a ratio of an emission width of the emitters on a bar to a grid dimension, is generally significantly greater than 50% and can reach up to 90%. That is, almost the entire epitaxial surface can be used in the laser bar to generate light. For example, a typical semiconductor laser for the infrared spectral region has 25 emitters with in each case 300 μm emission regions in a grid of 400 μm, corresponding to a filling factor of 75%. As a rule, the bars have a total width of around 10 mm.

However, the design of infrared-emitting semiconductor lasers cannot easily be transferred to AlInGaN semiconductor lasers. A laser bar based on AlInGaN with a high filling factor of, in particular, more than 40% does not work on account of the significantly reduced efficiency and the high thermal crosstalk between adjacent emitter strips.

In the semiconductor laser described here, the design can be optimized for high optical output powers of InGaN laser bars in the blue spectral range or in the near ultraviolet spectral range. Several external parameters are taken into account, for example, the type of mounting of the bar or a maximum permissible temperature of the active zone. The maximum optical output power is determined in particular by the maximum of the conversion efficiency of electrical power to optical power.

With the semiconductor laser described here, the production of high-performance laser bars, based on the material system InGaN, for blue light or near-ultraviolet radiation with maximum achievable power and the best possible cost-to-optical power ratio is made possible. Because of the comparatively low filling factor, very low beam parameter products can also be achieved, whereby a high beam quality is also given at the maximum available power. The laser radiation produced can thus be used in small and/or brilliant glass fibers for transporting the radiation to the site of use or for pumping other lasers.

In addition, a high degree of reliability is given, since more emitters per bar are present particularly in the case of small grid dimensions, and a single failure is reflected into a comparatively low percentage power drop. Due to the low filling factors, defective emitters do not influence the adjacent emitters so that the adjacent emitters are more stable in operation with respect to their reliability, since a lower temperature increase occurs due to heating due to a defective emitter.

The required optimization for the filling factor is based, in particular, on the fact that the thermal loads increase with an excessively high current intensity. In particular, thermal cross-talk reduces the efficiency of the emitters. In this way, it is possible that, in the case of closely adjacent emitters, the achievable optical output power decreases as a result of the amplified thermal crosstalk and no increase in power can be achieved even by higher current intensities, at a reasonable service life.

By means of the lower filling factor and the improved cooling achievable therewith per emitter, however, higher currents per emitter are possible, so that a greater optical output power is available despite a smaller area of the semiconductor layer sequence contributing to the generation of the laser radiation. As a result, the cooling and the thermal resistance towards the heat sink together with the filling factor influence the maximum optical output power that can be achieved.

In summary, thermal crosstalk between the emitters leads to mutual heating. The associated increase in the barrier layer temperature, in particular the temperature of the active zone, leads to a thermal rollover of the emitters. In the present case, semiconductor lasers having a design for laser bars are thus specified, which provide maximum achievable electro-optical conversion efficiency and thus also the maximum optical output power for given boundary conditions, such as the type of cooling, the maximum permissible barrier layer temperature and so on.

According to at least one embodiment, for the filling factor FF as a function of the thermal resistance Rth the following applies:

$$FF = (0.18 W^2/K^2 Rth^2 0.40 W/K\ Rth + 0.30) + 0.02.$$

Preferably, the tolerance is only $.+-.0.01$, alternatively is at most $.+-0.03$. That is, the filling factor depends approximately quadratically on the thermal resistance. This approximation applies in particular to thermal resistances in the range from 0.3 K/W to 1.2 K/W. These are common values for the thermal resistance for widespread contacting techniques of the semiconductor layer sequence to the heat sink.

According to at least one embodiment, the filling factor is at least 0.01 or 0.04 or 0.05 or 0.07 or 0.09 or 0.12. Alternatively or additionally, the filling factor is at most 0.2 or 0.18 or 0.16. Particularly preferred are filling factors between 0.12 and 0.16 inclusive or between 0.09 and 0.13 inclusive, particularly preferably between 0.04 and 0.18 inclusive. Especially in pico lasers and/or single-mode lasers, the filling factor can also be at very low values, such as at least 0.5% and/or at most 5%.

According to at least one embodiment, the semiconductor layer sequence comprises at least 3 or 6 or 12 or 20 of the emitter strips, referred to briefly as emitters. Alternatively or additionally, the number of emitters per semiconductor laser and per semiconductor layer sequence is at most 100 or 80 or 50. In particular, 23 or 46 of the emitter strips are present.

According to at least one embodiment, the width of the emitter strips is at least 10 μm or 20 μm or 30 μm or 40 μm. Alternatively or additionally, the width is at most 200 μm or 100 μm or 75 μm. In particular, the width of the emitter strips is between 15 μm and 150 μm.

According to at least one embodiment, a total width of the emitter strips and/or of the envelope, in particular perpendicular to the beam direction, is at least 0.1 mm or 0.4 mm or 1.2 mm or 4 mm. Alternatively or additionally, the total width is at most 30 mm or 20 mm or 12 mm.

According to at least one embodiment, the emitter strips have a length of at least 0.3 mm or 0.6 mm or 0.9 mm along the beam direction. Alternatively or additionally, this length is at most 6 mm or 4 mm or 2 mm or 1.5 mm. In particular, this length is between 0.4 mm and 4 mm inclusive.

According to at least one embodiment, the semiconductor layer sequence alone or together with a growth substrate has a thickness of at least 50 µm or 80 µm or 110 µm. Alternatively or additionally, this thickness is at most 0.4 mm or 0.2 mm.

According to at least one embodiment, the heat sink is attached to the semiconductor layer sequence and/or to the growth substrate of the semiconductor layer sequence by means of a soft solder such as In or silver-aluminum-copper, SAC for short, or else by means of silver sintering.

According to at least one embodiment, the heat sink is attached to the semiconductor layer sequence and/or to the growth substrate by means of a hard solder. For example, an AuSn solder is used.

According to at least one embodiment, the heat sink is based on a metal or a ceramic. Composite materials for the heat sink can be used. In particular, the heat sink is a CuW submount.

According to at least one embodiment, the heat sink is actively cooled. For example, the heat sink is then cooled via the Peltier effect and/or a gaseous or liquid flowing coolant is used. Alternatively, the heat sink operates passively, that is, via heat radiation and/or heat dissipation.

According to at least one embodiment, the semiconductor laser comprises a plurality of heat sinks, for example, exactly two heat sinks. The heat sinks can be located on both sides of the semiconductor layer sequence. In other words, the semiconductor layer sequence can form a sandwich with the heat sinks.

According to at least one embodiment, the semiconductor layer sequence is attached to the heat sink by means of a connecting means such as a solder or an adhesive. The connecting means preferably extends over the entire surface and uninterruptedly between the semiconductor layer sequence and the at least one heat sink in order to achieve a low thermal resistance. Alternatively, the connecting means can be structured to form electrical connection regions.

According to at least one embodiment, a reflectivity for the generated laser radiation at a coupling-out surface of the semiconductor layer sequence is at least 1% or 5% or 10% or 15% or 20%. Alternatively or additionally, the reflectivity is at most 35% or 30% or 25%. The coupling-out surface can be a decoupling facet. The coupling-out surface can represent an end surface of a resonator for the laser radiation. A further end surface of the resonator is preferably highly reflective with a reflectivity of preferably at least 95% or 98% or 99% or 99.8%. The reflectivity of the coupling-out surface can also influence the efficiency of the laser and the optimum filling factor, since an optical energy density and an absorption of radiation within the semiconductor layer sequence are influenced by the amount of laser radiation directly coupled out.

According to at least one embodiment, the emitter strips are each designed as a strip waveguide. This means that the laser radiation is guided by means of a refractive index difference via a geometry of the emitter strips. Alternatively, the emitter strips can be gain-guided, that is, without geometric structuring, essentially by limiting a current impressing surface into the semiconductor layer sequence.

According to at least one embodiment, between adjacent emitter strips the semiconductor layer sequence is only partially removed. Alternatively, the semiconductor layer sequence can be completely removed between adjacent emitter strips, for example, up to a growth substrate or up to the heat sink. If present, the growth substrate can also be partially or completely removed between the emitter strips.

According to at least one embodiment, the active zone extends continuously across all emitter strips. Alternatively, the active zone is removed between adjacent emitter strips, wherein the semiconductor layer sequence preferably extends continuously over all emitter strips.

Moreover, an operating method for such a semiconductor laser is provided. Features of the operating method are therefore also disclosed for the semiconductor laser and vice versa.

In at least one embodiment, the semiconductor layer sequence comprising the emitter regions is operated with a target operating current so that a maximum optical output power of the generated laser radiation results. The desired operating current is specified for an average service life of the semiconductor laser of, for example, 10,000 hours. That is, the operating current is such that an adequate long service life of the semiconductor laser is achieved. In contrast, significantly increased currents lead to a significantly shortened service life of the semiconductor laser.

According to at least one embodiment, the optical output power decreases with a reduction as well as in the case of an increase in the filling factor. This is particularly independent of a change in the operating current specified for a service life of, for example, 10,000 hours. This means, by increasing the operating current, and having a simultaneously high service life, an increase in the optical output power cannot be achieved with.

According to at least one embodiment, material machining such as welding, cutting, drilling or hardening is carried out during operation using the semiconductor laser. The material is processed, for example, under water. Alternatively or additionally, a material which is not suitable for processing by infrared or near-infrared radiation, is processed. For example, the material to be processed has a reflectivity of at least 80% or 90% for infrared radiation, for example, at a wavelength of 1 µm and/or of 10 µm, such as, for example, in the case of gold or copper. In contrast, processing, in particular for materials which appear yellowish, such as gold or copper, can be carried out efficiently in the blue or near ultraviolet spectral range using the semiconductor laser described here.

According to at least one embodiment, during operation the optical output power of the semiconductor laser is on average at least 30 W or 50 W or 80 W. Alternatively or additionally, the optical output power is in average at most 250 W or 150 W.

Moreover, a method for determining the optimal filling factor is provided. The method relates to a semiconductor laser as described in connection with one or more of the above-mentioned embodiments. Features of the semiconductor laser and of the operating method are therefore also disclosed for the method and vice versa.

In at least one embodiment, the method for determining the optimal filling factor comprises the following steps, for example, in the order given:

A) determining geometric parameters of the semiconductor layer sequence, in particular the dimensions thereof, specifically in the not yet subdivided or structured state, B) determining electrical parameters of the semiconductor layer sequence, in particular the threshold current density thereof, the specific surface conductivity thereof, the steepness which corresponds to a laser characteristic curve, that is, a current-power characteristic curve, and/or the maximum temperature thereof of the active zone, C) determining the thermal properties and parameterizing the thermal properties, in particular a thermal connection of the semiconductor layer sequence to the at least one heat sink, D) inserting the determined values into an equation or an equation system for the optical output power and/or for a target operating current, and E) determining the filling factor on the basis of the equation or the equation system taking into account a temperature on a side of the semiconductor layer sequence towards the at least one heat sink.

The filling factor and the thermal resistance, which results from the thermal connection of the semiconductor layer sequence to the at least one heat sink, calls for each other, thus indicating a mutual dependency.

Optionally, optical parameters can also be determined, for example, the reflectivity of the coupling-out surface of the semiconductor layer sequence.

A semiconductor laser described here, an operating method described here and a method described here are explained in more detail with reference to the drawing on the basis of exemplary embodiments. Identical reference symbols indicate identical elements in the individual figures. However, no references true to scale are shown, but rather individual elements can be illustrated in an exaggerated manner for better understanding.

IN THE FIGURES

Figure 1:
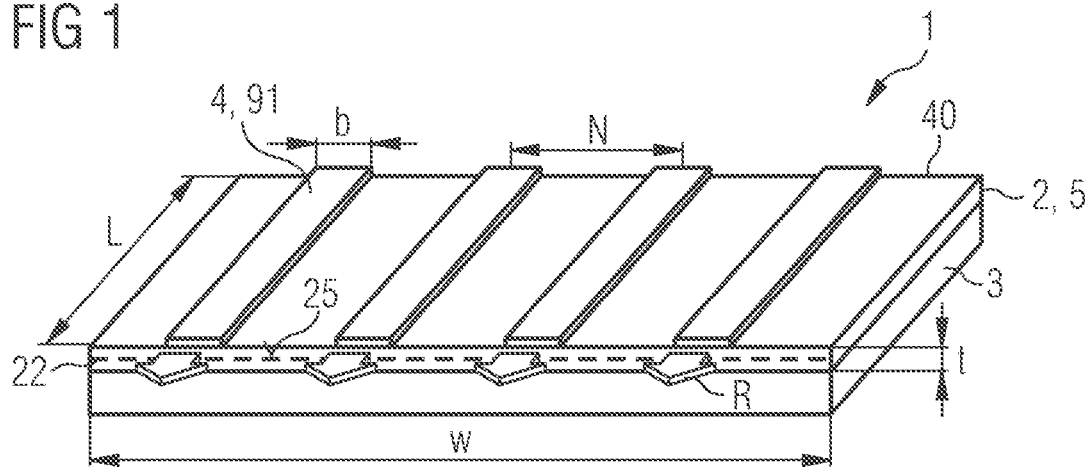

FIG. 1 shows a perspective schematic illustration of an embodiment of a semiconductor laser described herein, FIGS. 2 to 7 and 17 show schematic sectional views of exemplary embodiments of semiconductor lasers described herein, FIGS. 8 and 9 show schematic illustrations of operating methods for exemplary embodiments of semiconductor lasers described herein, FIGS. 10 to 13 show schematic representations of an optical output power as a function of a filling factor for exemplary embodiments of semiconductor lasers described herein, FIG. 14 shows a schematic listing of parameters for determining the filling factor for the embodiments of FIGS. 10 to 13, and FIGS. 15 and 16 show top views of formula-like relationships for determining the filling factor.

An exemplary embodiment of a semiconductor laser 1 is shown in FIG. 1. The semiconductor laser 1 comprises a heat sink 3, for example, based on CuW. A semiconductor layer sequence 2 is attached to the heat sink 3. The heat sink 3 can be designed as a printed circuit board.

The semiconductor layer sequence 2 is based on the material system AlInGaN. In operation, preferably blue light, which emerges from the semiconductor layer sequence 2 along a beam direction R, is generated in an active zone 22 of the semiconductor layer sequence 2. Optionally, the semiconductor layer sequence 2 is still located on a growth substrate 5.

The semiconductor laser 1 comprises a plurality of emitter strips 4, each of which is designed to generate the laser radiation. The semiconductor laser 1 may be a gain-controlled laser, so that the semiconductor layer sequence 2 is substantially unstructured as shown in FIG. 1. In this case, the emitter strips 4 are defined in particular by means of strip-shaped first electrodes 91 which are attached to the emitter strips 4 along the beam direction R.

A width b of the emitter strips 4 is, for example, 50 μm, a grid dimension N corresponding to a periodicity of the emitter strips 4 is, for example, 400 μm. This results in a filling factor b/N of 12.5%. That is, only a small portion of the active zone 22 is actually energized and serves to generate the laser radiation.

A length L of the emitter strips 4 is, for example, 1.2 mm. A total width w of an envelope 40 of the emitter strips 4 or of the semiconductor layer sequence 2 is, for example, 9.2 mm. A thickness t of the semiconductor layer sequence 2, alone or together with the growth substrate, is preferably in the range between at least 3 μm or 5 μm and at most 100 μm or 150 μm.

In comparison with other material systems, a maximum optical output power P can be achieved with AlInGaN with only a very low filling factor FF. This applies to operation with currents in which the semiconductor layer sequence has a long service life, for example, a service life of at least 1 000 hours or 10 000 hours.

The filling factor FF is thus preferably defined as the quotient of the width b of the emitter strips 4 and the grid dimension N. If the emitter strips 4 are present at different distances from one another, an average grid dimension can be used. If the semiconductor layer sequence 2 and/or the heat sink 3 has wide edges which are free of emitter strips 4, an envelope 40 can be defined around the emitter strips 4 as a base surface.

Figures 16, 17:
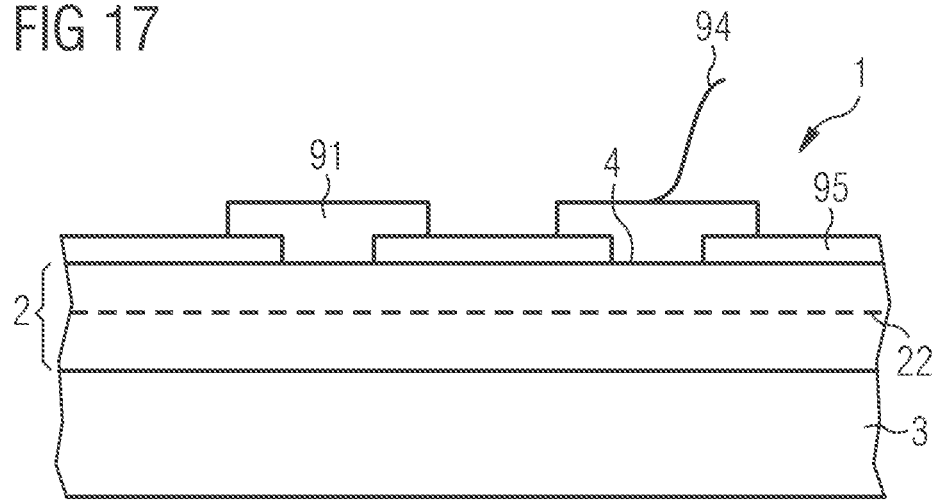

In contrast to FIG. 1, in the example of FIG. 17, the electrode 91 is in fact structured in strips, but energization regions of the gain-controlled semiconductor laser 1 of FIG. 17 are narrower than the strips of the electrode 91 itself. The emitter strips 4 are thus defined via openings in an electrical insulation layer 95, for example, of $SiO_2$. The strips of the electrode 91 partially cover the insulation layer 95. The strips of the electrode 91 can be electrically contacted individually via electrical connecting means 94 such as bonding wires. In contrast to FIG. 17, the electrode 91 can also be designed as a continuous layer over all emitter strips 4, analogously to FIG. 7.

Figure 2:
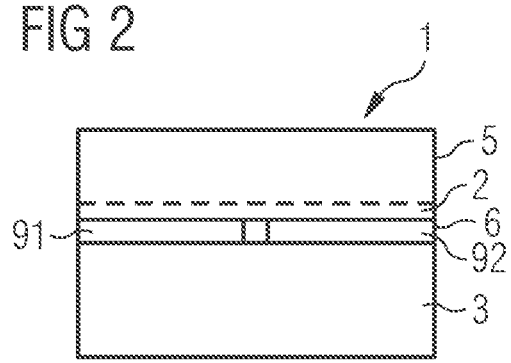

In the exemplary embodiment of FIG. 2, it is illustrated that the semiconductor layer sequence 2 is attached to the heat sink 3 via a connecting means 6. The connecting means 6 can be structured to form large-area electrodes 91, 92. Correspondingly, the heat sink 3 has associated contact surfaces and the heat sink 3 can again be a printed circuit board for electrically connecting the semiconductor layer sequence 2.

Furthermore, it is shown in FIG. 2 that the semiconductor layer sequence 2 is still located on the growth substrate 5. The growth substrate 5 is located on a side of the semiconductor layer sequence 2 facing away from the heat sink 3.

The growth substrate 5 is, for example, of GaN, AlN, AlGaN, InN, InGaN or AlInGaN. Furthermore, substrates outside the material system AlInGaN can be used, for example, growth substrates 5 made of sapphire, silicon carbide or silicon. The semiconductor layer sequence 2 is preferably grown on a polar surface such as a {0001} surface or on a non-polar surface such as a-{11-20}, m-{1-100} or {-1100}, or on a semipolar surface such as {11-22}, {20-21}, {20-2-1}, {30-31} or {30-3-1}.

The electrodes 91, 92 are in particular metallizations, for example, comprising or consisting of Pd, Ni, Ti, Pt and/or Au. A material of the heat spreader is, for example, silicon carbide, AlN, diamond, direct bond copper or DBC for short, copper and/or CuW. The heat sink 3 may be an active or a passive component. One design of the heat sink 3 is, for example, corresponding to an MCC mount, CS mount, C mount, TO mount or HPL mount. Cooling of the semiconductor layer sequence 2 by the heat sink 3 can take place from one side, from two sides, from three sides, from four sides or from five sides. It is thus possible that only the coupling-out surface 25 is partially or completely free of the heat sink 3.

The above-mentioned statements apply correspondingly also to all other exemplary embodiments.

Figure 3:
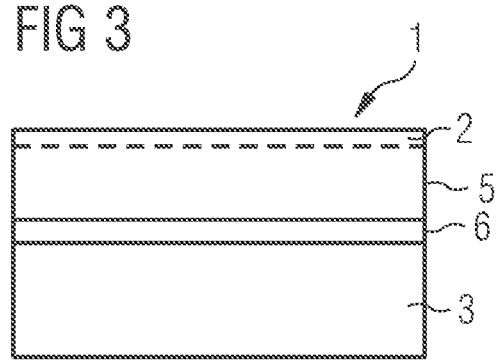

In the exemplary embodiment of FIG. 3, it is illustrated that the semiconductor layer sequence 2 is located on a side of the growth substrate 5 facing away from the heat sink 3. The connecting means 6 extends continuously and over the entire surface between the growth substrate 5 and the heat sink 3. electrodes are not shown in FIG. 3.

Figure 4:
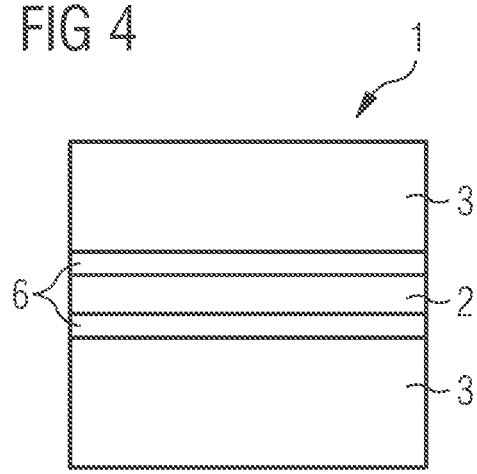

It can be seen from FIG. 4 that the semiconductor layer sequence 2 is located between two of the heat sinks 3, in each case connected via the connecting means 6, which is, for example, a hard solder from the material system AuSn. Again, electrodes are not shown.

Figure 5:
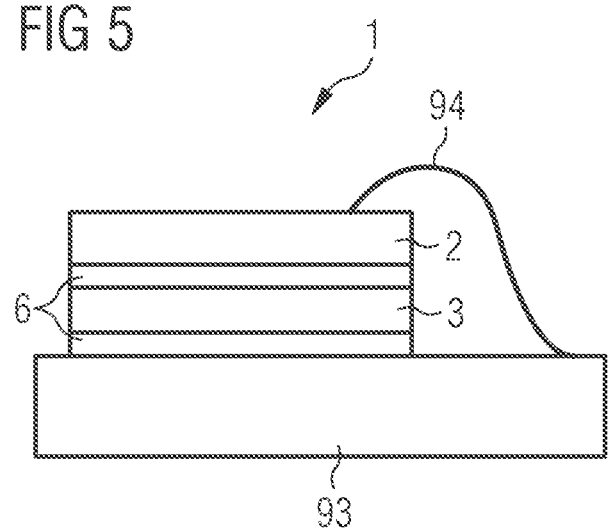

According to FIG. 5, the semiconductor layer sequence 2, for example, without a growth substrate, is coupled to a carrier 93 via two of the connecting means 6 and the heat sink 3. The carrier 93 can be a printed circuit board. An electrical connection preferably takes place via one or more electrical connections 94, for example, in the form of bonding wires or electrically conductive flat coatings over side surfaces of the semiconductor layer sequence 2.

FIG. 6 shows that the emitter strips 4 are index-guided structures and thus form strip waveguides. In FIG. 6, the beam direction R runs perpendicular to the plane of the drawing. The semiconductor layer sequence 2 is thus partially removed between adjacent emitter strips 4. The active zone 22 may extend continuously across all emitter strips 4.

Optionally, the first electrode 91 is located on the emitter strips 4. The first electrode 91 can cover the emitter strips 4 partially or, deviating from the illustration in FIG. 6, completely. The second electrode 92 is optionally located on a side of the heat sink 3 facing away from the semiconductor layer sequence 2 and can be configured in a planar manner over a plurality of emitter strips 4.

In the exemplary embodiment of FIG. 7, the semiconductor laser 1 is also a strip waveguide laser. In this case, the active zone 22 can be removed between adjacent emitter strips 4. An electrical insulation layer 95, on which the first electrode 91 is applied in a planar manner, is located on the semiconductor layer sequence 2. The second electrode 92 is located, for example, on the electrically conductive growth substrate 3. Top sides of the emitter strips 4 are predominantly free of the insulation layer 95 and otherwise covered with the first electrode 91. As also in all other embodiments, the first electrode 91 may be composed of a plurality of metal layers. The same applies to the second electrode 92. An external electrical connection can take place via the electrodes 91, 92, which can thus be electrical connection surfaces.

FIG. 8 shows an operating method of the semiconductor laser 1. In this case, a material 8 to be processed is under water 7 and is irradiated along the beam direction R with the blue or near ultraviolet laser radiation. Such an application is not possible with high-power infrared lasers.

According to FIG. 9A, the material 8 is also processed with a semiconductor laser 1 described here. The material 8 is reflective for infrared or near-infrared radiation and has, for example, a surface of gold or copper. Accordingly, see FIG. 9B, no processing with an infrared laser 1' is possible because the radiation R' is predominantly reflected on the material 8 to be processed.

FIGS. 10 to 13 each show a dependence of the optical output power P in W as a function of the filling factor FF for various thermal connections and configurations of the heat sink and for different grid dimensions N. In FIG. 14, an associated table is found with parameters which flow into a determination of an optimum filling factor FF, as explained in more detail below in connection with the formulae of FIGS. 15 and 16.

According to FIG. 10, the InGaN laser bar 1 is mounted with an AuSn hard solder on a CuW heat sink 3 with passive cooling. This results in a thermal resistance Rth of approximately 1 K/W. The optimum filling factor FF is approximately 8%, independent of the grid dimension N. The maximum optical output power P achievable is nearly 60 W.

In FIG. 11, instead of passive cooling, a micro-channel cooler is used, whereby the thermal resistance Rth decreases to approximately 0.75 K/W. The filling factor FF, at which the maximum optical output power P of nearly 80 W is achieved, is 10%.

In FIG. 12, soft solder mounting of the InGaN laser bar 1 with indium takes place on a microchannel cooler resulting in a thermal resistance Rth of approximately 0.61 K/W Thus, the filling factor FF for an optimum optical output power P of around 90 W is 12%.

With respect to FIG. 12, a 20% improved cooling is assumed in FIG. 13. The thermal resistance Rth is thus 0.45 K/W to 0.5 K/W, resulting in an optimum filling factor FF of 15% at an optical output power P of a maximum of approximately 120 W.

Furthermore, it can be seen from FIGS. 10 to 13 that, for better thermal distribution, the grid dimension N is to be selected comparatively low, since the optical output power P decreases with a larger grid size N. The grid dimension N is preferably at most 150 µm. In FIGS. 10 to 13, the length L of the emitter strips 4 is 1.2 mm each.

In conjunction with FIGS. 15 and 16, a model is created for determining the estimation of the barrier layer temperature Tj, that is, in particular a temperature of the active zone 22, which is based on a modeling of the thermal resistance Rth dependent on the filling factor FF. In this case, boundary conditions for reliable long-term operation have been established. This results in a specification of the maximum allowed barrier layer temperature Tj, in particular 135° C. Furthermore, a self-consistent calculation of the single emitter light power at the upper limit of the barrier layer temperature Tj was carried out. A projection was then carried out to the entire bar 1. For different cooling configurations, the maximum optical output power P was determined as a function of the filling factor FF.

This takes into account thermal crosstalk between adjacent emitter strips, which leads to mutual heating of the emitter strips 4. The increase in the barrier layer temperature Tj associated with this heating leads to a thermal rollover of the laser diodes, connected with a drop in the achievable optical output power P when the filling factor FF is too high.

In particular, the thermal resistance Rth, which depends in particular on the filling factor FF, and parameters f, $c_1$ (L), $c_2$ for the thermal connection is included in the calculation. Furthermore, an active chip area A results, as indicated in FIG. 16, by a length L of the emitter strips 4 as well as the total width w. A threshold current Is is also dependent on the filling factor FF as well as on a threshold current density Js. An electrical series resistance Rs is also dependent on the electrical surface conductivity ρ of the semiconductor layer sequence 2, if necessary together with the growth substrate 5. Furthermore, a steepness Sh of the current-power characteristic is required. In addition, the electrical series resistance Rs, which is also dependent on the filling factor FF, is considered. In addition, the input voltage Uop must be taken into account. These parameters are to be determined in particular for the maximum predetermined permitted barrier layer temperature Tj and can be determined experimentally or also modeled.

The indices op indicate the respective operating current or the respective operating voltage. Ploss refers to the power loss. The temperature Ths refers to a boundary surface temperature of the semiconductor layer sequence 2 towards the at least one heat sink 3, so that the temperature Ths on the side of the semiconductor layer sequence in the direction of the at least one heat sink is taken into account.

From the relationships indicated in FIG. 15, the operating current Iop is thus obtained, see V in FIG. 15. In this case, the above-mentioned dependencies from FIG. 16 are to be taken into account.

The optical output power P can be calculated by inserting the operating current Iop from V into I. If the filling factor FF is then varied, the dependence of the above-mentioned laser input parameters results in different results relating to Iop and to the output power P. On the basis of this, the optimum can be found on the basis of the filling factor FF and the cooling used.

Here, the thermal resistance Rth, as indicated in FIG. 16, is parameterized. In this case, f represents a factor, $c_1$ (L) and $c_2$ are constants in each case for a design variant with a predefined resonator length L, for example, 1.2 mm. Exemplary values can be gathered from the table in FIG. 14. In the formula for the thermal resistance Rth of FIG. 16, the variable w is to be used without units, corresponding to the numerical value of the indication of w in μm.

The results show, as illustrated in FIGS. 10 to 13, that the maximum optical output power P is achieved by filling factors FF at around 10%. In this case, the optimum filling factor FF increases with decreasing thermal resistance Rth. An improved optical output power P can thus be achieved by means of the cooling technique.

A position of the maximum of the operating current Iop is independent of the number of emitter strips 4 with the same filling factor FF and the same emitter design in the calculations. Therefore, the maximum found applies to all bars with different widths as long as the filling factor FF does not change.

The emitter strips 4 are preferably arranged in a grid which is as narrow as possible. Thus, more emitter strips 4 are obtained per bar 1, so that the effects of defective emitter strips 4 on account of epitaxial defects or individual emitter defects on the total power of the laser bar 1 are only slight.

Overall, design criteria of the laser bars 1 for the filling factor FF are thus specified, which provide the maximum achievable electro-optical conversion efficiency and thus also the maximum optical output power for given boundary conditions such as the type of cooling and the maximum permissible barrier layer temperature Tj.

Optionally, a mirror reflectivity of the coupling-out surface 25 can additionally flow into the calculation. However, this influence is dependent on the thermal resistance Rth. By means of the reflectivity of the coupling-out surface 25, optical losses in the semiconductor layer sequence 2, assuming a sufficient amplification factor, can be reduced. Thus, the reflectivity of the coupling-out surface 25 is preferably at least 15%, for example, 22%±1% or 27%±1%.

Unless indicated otherwise, in each case the components shown in the figures follow one another directly in the specified sequence. Layers which are not in contact in the figures are preferably spaced apart from one another. If lines are drawn parallel to one another, the corresponding surfaces are preferably likewise aligned parallel to one another. Likewise, unless indicated otherwise, the relative positions of the illustrated components with respect to one another are correctly reproduced in the figures.

The invention described here is not limited by the description with reference to the exemplary embodiments. Rather, the invention comprises each novel feature and any combination of features, including, in particular, any combination of features in the claims, even if this feature or combination itself is not explicitly recited in the claims or embodiments.

LIST OF REFERENCES SYMBOLS 1 semiconductor laser
2 semiconductor layer sequence
22 active zone
25 coupling-out
3 heat sink
4 emitter strip
40 envelope
5 growth substrate
6 connecting means
7 water
8 material to be processed
91 first electrode
92 second electrode
93 carrier
94 electrical connection
95 electrical insulation layer
b width of the emitter strips
FF filling factor
L length of emitter strips
N grid dimension
P optical output power
R beam direction
t thickness of the semiconductor layer sequence/growth substrate
w total width of the envelope

The invention claimed is:
1. A semiconductor laser comprising:
a semiconductor layer sequence on a basis of a material system AlInGaN with at least one active zone, and
at least one heat sink to which the semiconductor layer sequence is thermally connected and to which the semiconductor layer sequence has a thermal resistance,
wherein the semiconductor layer sequence is divided into a plurality of emitter strips and each emitter strip has a width between 15 μm and 150 μm inclusive in a direction perpendicular to a beam direction, the emitter strips are arranged with a filling factor (FF) of between 0.07 and 0.18 inclusive and the filling factor (FF) is a quotient of a width b of the emitter strips and a periodicity N of the emitter strips,
the semiconductor layer sequence is attached by a solder to the heat sink and the solder extends over an entire surface and uninterruptedly between the semiconductor layer sequence and the at least one heat sink, and
the semiconductor layer sequence is located on a growth substrate thereof and the growth substrate is located on a side of the semiconductor layer sequence facing away from the heat sink,
wherein the following applies to the filling factor (FF) as a function of thermal resistance Rth:

$$FF=(0.18W^2/K^2 Rth^2-0.40W/K\ Rth+0.30)\pm0.02,$$

wherein each of the emitter strips are each configured as strip waveguides, wherein the at least one active zone is removed between adjacent emitter strips, wherein the at least one heat sink is attached by a soft solder to the semiconductor layer sequence, wherein the soft solder comprises indium and the at least one heat sink is a microchannel cooler.

2. The semiconductor laser according to claim 1, wherein the filling factor is between 0.12 and 0.16.

3. The semiconductor laser according to claim 1, wherein the filling factor is between 0.09 and 0.13 inclusive.

4. The semiconductor laser according to claim 1, wherein the semiconductor layer sequence comprises at least 12 and at most 80 of the emitter strips.

5. The semiconductor laser according to claim 1, comprising two heat sinks, wherein on both sides of the semiconductor layer sequence one of the heat sinks is located.

6. The semiconductor laser according to claim 1, wherein a reflectivity for a generated laser radiation at a coupling-out surface is at least 15% and at most 35%.

7. An operating method for a semiconductor laser according to claim 1, wherein the semiconductor layer sequence comprising emitter regions that are operated with a target operating current in such a way that a maximum achievable electro-optical conversion efficiency of generated laser radiation results, wherein the target operating current is specified for an average service life of the semiconductor laser of 10,000 h, and wherein optical output power decreases based on an increase in the filling factor, irrespective of a change in the target operating current for a service life of 10,000 h.

8. The operating method according to claim 7, wherein processing of a material is carried out by means of the semiconductor laser, wherein the material is processed under water and/or the material has a reflectivity for near-infrared radiation of at least 80%, and wherein the optical output power is at least 50 W on average.

9. A semiconductor laser comprising:
   a semiconductor layer sequence on a basis of a material system AlInGaN with at least one active zone, and
   at least one heat sink to which the semiconductor layer sequence is thermally connected and to which the semiconductor layer sequence has a thermal resistance,
   wherein the semiconductor layer sequence is divided into a plurality of emitter strips and each emitter strip has a width between 15 µm and 150 µm inclusive in a direction perpendicular to a beam direction, the emitter strips are arranged with a filling factor (FF) between 0.07 and 0.18 inclusive, and the filling factor (FF) is a quotient of a width b of the emitter strips and a periodicity N of the emitter strips and is set so that laser radiation having a maximum achievable electro-optical conversion efficiency generated during operation,
   wherein the following applies to the filling factor (FF) as a function of thermal resistance Rth:

$FF=(0.18 W^2/K^2 Rth^2 - 0.40 W/K\, Rth + 0.30) \pm 0.02$, wherein each of the emitter strips are each configured as strip waveguides, wherein the at least one active zone is removed between adjacent emitter strips.

10. The semiconductor laser according to claim 9, wherein the heat sink is attached by soft soldering to the semiconductor layer sequence.

11. The semiconductor laser according to claim 9, wherein the heat sink is attached by hard soldering to the semiconductor layer sequence.

12. A method for determining an optimum filling factor in a semiconductor laser with a range between 0.07 and 0.18 inclusive, comprising:
   A) determining geometric dimensions of a still unstructured semiconductor layer sequence;
   B) determining a threshold current density ($J_s$), a specific surface conductivity ($\rho$), a steepness ($S_h$) of a laser characteristic curve and a maximum temperature ($T_j$) of an active zone of the semiconductor layer sequence;
   C) determining and parameterizing a thermal connection of the semiconductor layer sequence to at least one heat sink;
   D) inserting determined values into an equation or an equation system for an optical output power (P) and/or for a target operating current ($I_{op}$); and
   E) determining a filling factor (FF) on a basis of the equation or the equation system taking into account a temperature ($T_{hs}$) on a side of the semiconductor layer sequence towards the at least one heat sink, wherein the filling factor (FF) is a quotient of a width b of emitter strips and a periodicity N of the emitter strips,
   wherein the filling factor (FF) and a thermal resistance ($R_{th}$), which results from the thermal connection of the semiconductor layer sequence to the at least one heat sink, are mutually dependent,
   wherein further for an optical power (P) of the semiconductor laser, a threshold current ($I_s$), an input voltage ($U_{op}$), an electrical series resistance ($R_s$), a length (L) of the emitter strips, a total width (w) of an envelope of the emitter strips, and an optical power loss ($P_{loss}$) holds true:

$$I_{op} = -(U_{op}-Sh) \pm \sqrt{(U_{op}-Sh)^2 - 4R_s(I_s Sh - T_j - T_{hs}/R_{th})}/2R_s \quad (V)$$

$$P = Sh(I_{op} - I_s) \quad (I)$$

$$P = R_s I_{op}^2 + U_{op} I_{op} - P_{loss} \quad (II)$$

$$T_j = T_{hs} + R_{th} P_{loss} \quad (III)$$

$$I_s = J_s * L * w * FF$$

$$R_s = \rho/L * w * FF$$

the optical output power (P) is calculated by inserting the target operating current ($I_{op}$) from (V) into (I), the filling factor (FF) is then varied, dependence of laser input parameters results in different results relating to $I_{op}$ and to the output power (P).

* * * * *